United States Patent
Barker

(10) Patent No.: US 11,263,825 B2
(45) Date of Patent: Mar. 1, 2022

(54) AGGREGATING DATA AND STORING INFORMATION IN CONNECTION WITH A DIGITAL STICKY NOTE ASSOCIATED WITH A FILE

(71) Applicant: Boom Interactive Inc., Salt Lake City, UT (US)

(72) Inventor: Jeremiah Timberline Barker, Cottonwood Heights, UT (US)

(*) Notice: Subject to any disclaimer, the term of this patent is extended or adjusted under 35 U.S.C. 154(b) by 0 days.

(21) Appl. No.: 16/900,520

(22) Filed: Jun. 12, 2020

(65) Prior Publication Data

US 2020/0394835 A1     Dec. 17, 2020

Related U.S. Application Data

(60) Provisional application No. 62/860,461, filed on Jun. 12, 2019.

(51) Int. Cl.

| | | |
|---|---|---|
| *G06T 19/20* | (2011.01) | |
| *G06T 15/04* | (2011.01) | |
| *G06K 9/62* | (2022.01) | |
| *G06K 9/46* | (2006.01) | |
| *G06T 7/90* | (2017.01) | |
| *G06F 3/04847* | (2022.01) | |
| *G06T 7/40* | (2017.01) | |
| *G06T 17/00* | (2006.01) | |
| *G06T 7/181* | (2017.01) | |
| *G06T 7/13* | (2017.01) | |
| *G06F 30/13* | (2020.01) | |

(52) U.S. Cl.
CPC .......... *G06T 19/20* (2013.01); *G06F 3/04847* (2013.01); *G06F 30/13* (2020.01); *G06K 9/4652* (2013.01); *G06K 9/6256* (2013.01); *G06T 7/13* (2017.01); *G06T 7/181* (2017.01); *G06T 7/40* (2013.01); *G06T 7/90* (2017.01); *G06T 15/04* (2013.01); *G06T 17/00* (2013.01); *G06T 2207/20084* (2013.01); *G06T 2210/04* (2013.01); *G06T 2219/2012* (2013.01)

(58) Field of Classification Search
CPC .......... G06T 15/04; G06T 7/12; G06T 7/181; G06K 9/4652; G06K 9/4604
See application file for complete search history.

(56) References Cited

U.S. PATENT DOCUMENTS

| | | | |
|---|---|---|---|
| 2012/0065944 A1 | 3/2012 | Nielsen et al. | |
| 2014/0344717 A1* | 11/2014 | Yamazoe | G06F 3/0482 |
| | | | 715/753 |
| 2017/0322918 A1* | 11/2017 | Watanabe | G06F 40/169 |
| 2019/0051051 A1 | 2/2019 | Kaufman et al. | |

OTHER PUBLICATIONS

United States Patent and Trademark Office, "International Search Report", dated Sep. 4, 2020, International Application No. PCT/US20/37548.

\* cited by examiner

*Primary Examiner* — Sam Bhattacharya

(57) ABSTRACT

Aggregating data and storing information in connection with a digital sticky note that can be displayed in connection with a file. A method includes generating a digital sticky note to be stored in connection with a file. The method includes storing a coordinate location in connection with the digital sticky note, wherein the coordinate location indicates where the digital sticky note should be displayed within the file. The method includes aggregating data to be stored in connection with the digital sticky note, wherein the data comprises information applicable to the coordinate location.

21 Claims, 8 Drawing Sheets

AGGREGATING DATA AND STORING INFORMATION IN CONNECTION WITH A DIGITAL STICKY NOTE ASSOCIATED WITH A FILE

CROSS-REFERENCE TO RELATED APPLICATION

This application claims the benefit of U.S. Provisional Patent Application No. 62/860,461, filed Jun. 12, 2019, titled "STANDALONE AND ONLINE PLATFORM FOR SELECTING, ORGANIZING AND NETWORKING PHYSICAL CONSTRUCTION PROJECTS USING 3 DIMENSIONAL REAL-TIME RENDERING EDITOR," which is incorporated herein by reference in its entirety, including but not limited to those portions that specifically appear hereinafter, the incorporation by reference being made with the following exception: In the event that any portion of the above-referenced provisional application is inconsistent with this application, this application supersedes the above-referenced provisional application.

TECHNICAL FIELD

The present disclosure relates to image processing and data storage.

BACKGROUND

Residential and commercial construction and remodeling projects can be extraordinarily complex. A relatively simple residential remodeling project, for example, can require multiple parties to make numerous decisions regarding floorplans, constructions materials, design materials, furnishings, and so forth. It is challenging to visualize how different construction and design materials will look together in a specific space. Further, and particularly for new-build construction or extensive remodeling, it can be challenging to visualize how a floorplan or cabinetry layout will look and feel.

Construction and design rendering programs currently known in the art are difficult to use and primarily directed for use by professionals who are trained to use a specific program. Additionally, these construction and design rendering programs can be extraordinarily expensive and are cost-prohibitive for average consumers. There is a need for a simple-to-use design rendering program that can generate three-dimensional renderings of a space based on two-dimensional drawings. Such a program would be useful for numerous entities in the construction and remodeling industries and would enable consumers to visualize a space with specific constructions materials prior to beginning construction.

In light of the foregoing, disclosed herein are systems, methods, and devices for improved design rendering programs. Specifically disclosed herein are systems, methods, and devices for data serialization extrusion of a two-dimensional drawing to generate a geometric three-dimensional rendering.

BRIEF DESCRIPTION OF THE DRAWINGS

Non-limiting and non-exhaustive implementations of the present disclosure are described with reference to the following figures, wherein like reference numerals refer to like or similar parts throughout the various views unless otherwise specified. Advantages of the present disclosure will become better understood with regard to the following description and accompanying drawings where.

DETAILED DESCRIPTION

Disclosed herein are systems, methods, and devices for aggregating data and storing information in connection with a digital sticky note associated with a file. An embodiment of the disclosure is a "digital sticky note" that can be stored in connection with a certain coordinate location in a file. The digital sticky note may be displayed at the coordinate location in the file and may provide information applicable to the coordinate location. In an embodiment, data can be aggregated and stored in connection with the digital sticky note.

Before the methods, systems, and devices for aggregating data and storing information in connection with a digital sticky note are disclosed and described, it is to be understood that this disclosure is not limited to the configurations, process steps, and materials disclosed herein as such configurations, process steps, and materials may vary somewhat. It is also to be understood that the terminology employed herein is used for describing implementations only and is not intended to be limiting since the scope of the disclosure will be limited only by the appended claims and equivalents thereof.

In describing and claiming the disclosure, the following terminology will be used in accordance with the definitions set out below.

It must be noted that, as used in this specification and the appended claims, the singular forms "a," "an," and "the" include plural referents unless the context clearly dictates otherwise.

As used herein, the terms "comprising," "including," "containing," "characterized by," and grammatical equivalents thereof are inclusive or open-ended terms that do not exclude additional, unrecited elements or method steps.

A detailed description of systems, methods, and devices consistent with embodiments of the present disclosure is provided below. While several embodiments are described, it should be understood that this disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments may be practiced without some or all of these details. Moreover, for clarity, certain technical material that is known in the related art has not been described in detail to avoid unnecessarily obscuring the disclosure.

Figure 1:
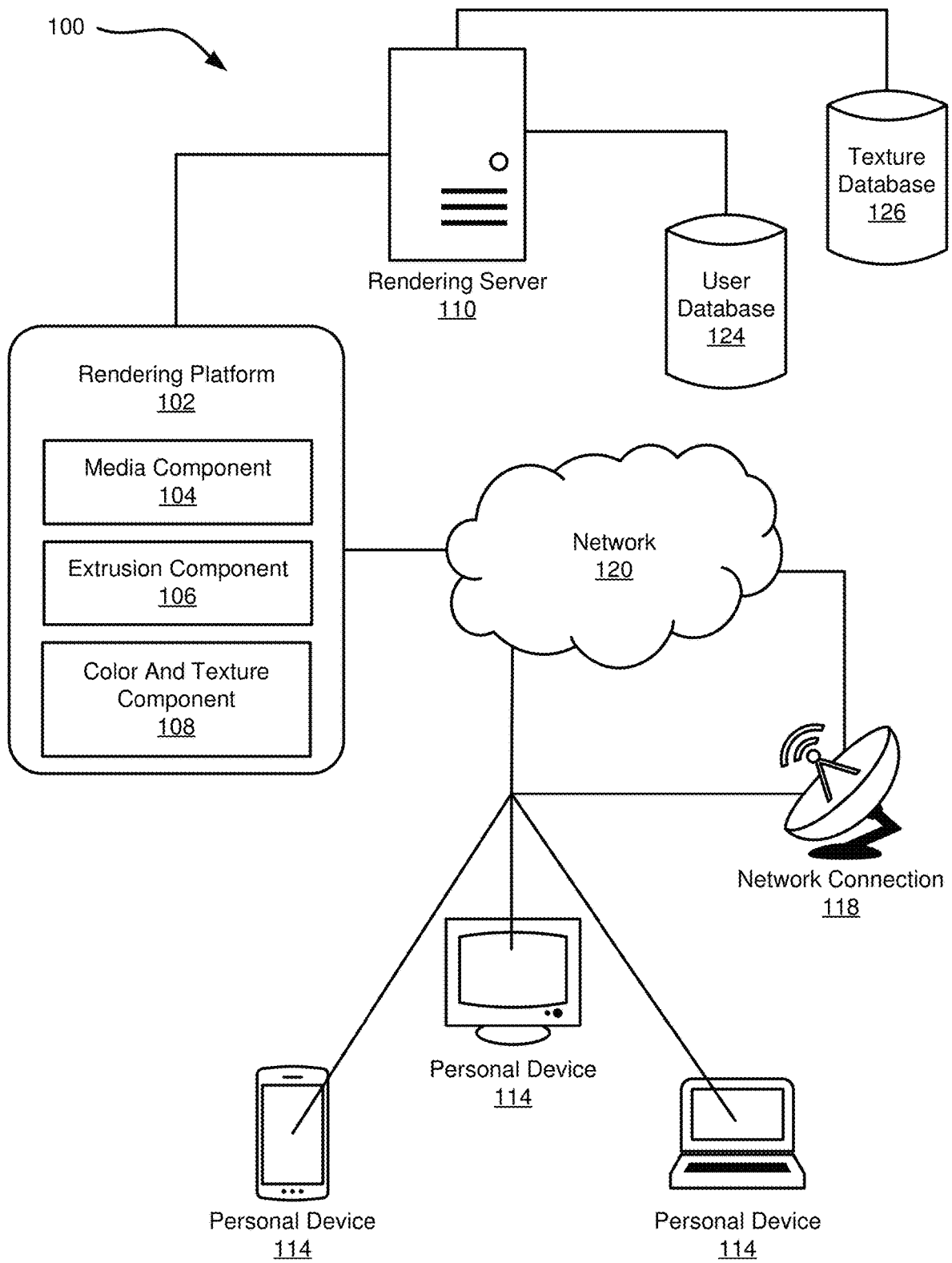
FIG. 1 is a schematic diagram of an design rendering system comprising a rendering platform operated by a rendering server in communication with a network.

Referring now to the figures, FIG. 1 is a schematic diagram of a system 100 for image rendering and visualization. The system 100 includes a rendering platform 102 in communication with a rendering server 110 and a network 120. The network 120 is in communication with the rendering server 110, and access to the network 120 may be achieved by way of a network connection 118 that may be connected with the rendering server and/or individual devices such as a personal device 114.

The rendering platform 102 includes one or more of a media component 104, an extrusion component 106, and a color and texture component 108. The rendering platform 102 may include further components and may be configured to perform additional instructions, for example according to the rendering platform 102 as discussed in FIG. 2. The rendering platform 102 can be accessed by way of a personal device 114 such as a smart phone, a tablet, a laptop, a personal computer, and so forth.

The media component 104 of the rendering platform 102 is configured to analyze and assess input media in furtherance of generating a three-dimensional rendering of a space. The media component 104 is configured to perform image recognition to identify objects, colors, shapes, textures, constructions materials, and so forth within media data. In an embodiment, the media component 104 comprises a neural network trained for image recognition and identification of objects, colors, shapes, textures, construction materials, and so forth.

In an embodiment, a user uploads media to the rendering server 110 by way of a user interface for the rendering platform 102. This media may be stored in one or more of the user database 124 and/or the texture database 126. The media may comprise images, videos, hyperlinks, products available in the marketplace, product Stock Keeping Units (SKUs), user-specified parameters, and so forth. The media component 104 is configured to analyze and assess the media to identify pertinent construction materials, design materials, floorplan preferences, textures, colors, and so forth. These identified materials and preferences may then be applied to a three-dimensional rendering of an interactive floorplan that may be customized to the user's own space.

For example, in an embodiment, the media comprises an image of an example kitchen that has been uploaded by the user. The user may indicate that the countertop shown in the image should be replicated and rendered in the user's own customizable three-dimensional rendering of the user's own kitchen floorplan. The media component 104 may be configured to analyze the image with a neural network to identify the countertop in the image and further to identify the color, texture, and/or type of countertop shown in the image. The media component 104 may, for example, determine that the example image comprises a marble countertop. The media component 104 may indicate that a marble countertop should be selected from the texture database 126, and then the marble countertop should be applied to the user's personalized and customizable rendering of the user's own kitchen floorplan.

The extrusion component 106 of the rendering platform 102 converts an input two-dimensional drawing into a geometric vector diagram. The geometric vector diagram can be used by the rendering server 110 or some other service to generate an interactive three-dimensional rendering of the objects illustrated in the input two-dimensional drawing. In an embodiment, the input two-dimensional drawing illustrates the floorplan of a residential or commercial construction project, a residential or commercial remodeling project, a landscaping construction project, and/or a landscaping remodeling project. The input two-dimensional drawing may be a computer-generated line drawing that follow traditional blueprint conventions for a construction or remodeling project. The input two-dimensional drawing may be a computer-generated line drawing that does not follow traditional blueprint conventions, and may alternatively be a hand-drawn floorplan, a photograph taken of a printed computer-generated or hand-drawn floorplan, and so forth. The extrusion component 106 analyzes and assess the input two-dimensional drawing and generates serialized data comprising a vector diagram equivalent to the floorplan illustrated in the input two-dimensional drawing. The vector diagram can be used to generate an interactive, customizable, three-dimensional rendering of the floorplan illustrated in the input two-dimensional drawing.

The color and texture component 108 of the rendering platform 102 applies colors, textures, constructions materials, design materials, user-defined preferences, and so forth to a three-dimensional rendering of a space. In an embodiment, the color and texture component 108 receives one or more indications from a user comprising parameters and preferences for the three-dimensional rendering. These parameters and preferences may comprise desired design materials such as tile, countertop, flooring, paint, and so forth, along with desired construction materials such as windows, doors, cabinetry, and so forth, along with desired floorplans and configurations. The color and texture component 108 implements these parameters and preferences into a three-dimensional rendering of the user's own space.

In an embodiment, the color and texture component 108 comprises a neural network trained to generate realistic renderings of countertops, flooring, tile, floorplans, windows, doors, and so forth. In an embodiment, the neural network comprises a variational autoencoder (VAE), a generative adversarial network (GAN), and/or a variational autoencoder generative adversarial network (VAE-GAN). The color and texture component 108 may be trained to combine a desired color with a desired texture. The texture and/or the color may be stored in the texture database 126. The color and texture component 108 may create a new never-before-created color-texture combination according to a user's preferences.

The personal device 114 is any personal computing device that can communicate with the rendering server 110. The personal device 114 may include a smart phone, a tablet, a laptop, a personal computer, virtual or augmented reality device, and so forth. Personal devices 114 may communicate with the rendering server 110 by way of a local area network (LAN) connection, a wide area network (WAN) connection, or another network connection. In an embodiment, personal devices 114 can connection to a network 120, such as a cloud computing network or the Internet, by way of a network connection 118.

The user database 124 is in communication with the rendering server 110. The user database 124 stores information about user accounts that are associated with the rendering platform 102. The user database 124 stores information about each user that has created an account with the rendering platform 102. The user database 124 stores, for example, personal user information, user preferences, data uploaded to the user's account, data saved to the user's account, aesthetic preferences designated by the user account, and so forth.

The texture database 126 is in communication with the rendering server 110. The texture database 124 stores media data comprising textures, colors, materials, and so forth that may be used for creating a rendering of a space. For example, the texture database 126 may comprise texture renderings and texture data for different mediums that may be used in architectural design. In an example implementation, the texture database 126 comprises texture information for a variety of a countertop options, for example, numerous colors of granite countertops, numerous colors of marble countertops, numerous colors of solid surface countertops, numerous colors of laminate countertops, and so forth. Further in the example implementation, the texture database 126 may comprise textures, shapes, and configurations for different types of tile, carpet flooring, hardwood flooring, laminate flooring, vinyl flooring, hardware, and so forth. The data stored in the texture database 126 is non-limiting, and any suitable data that may be used for generating a rendering of a space may be stored in and/or associated with the texture database 126.

Figure 2:
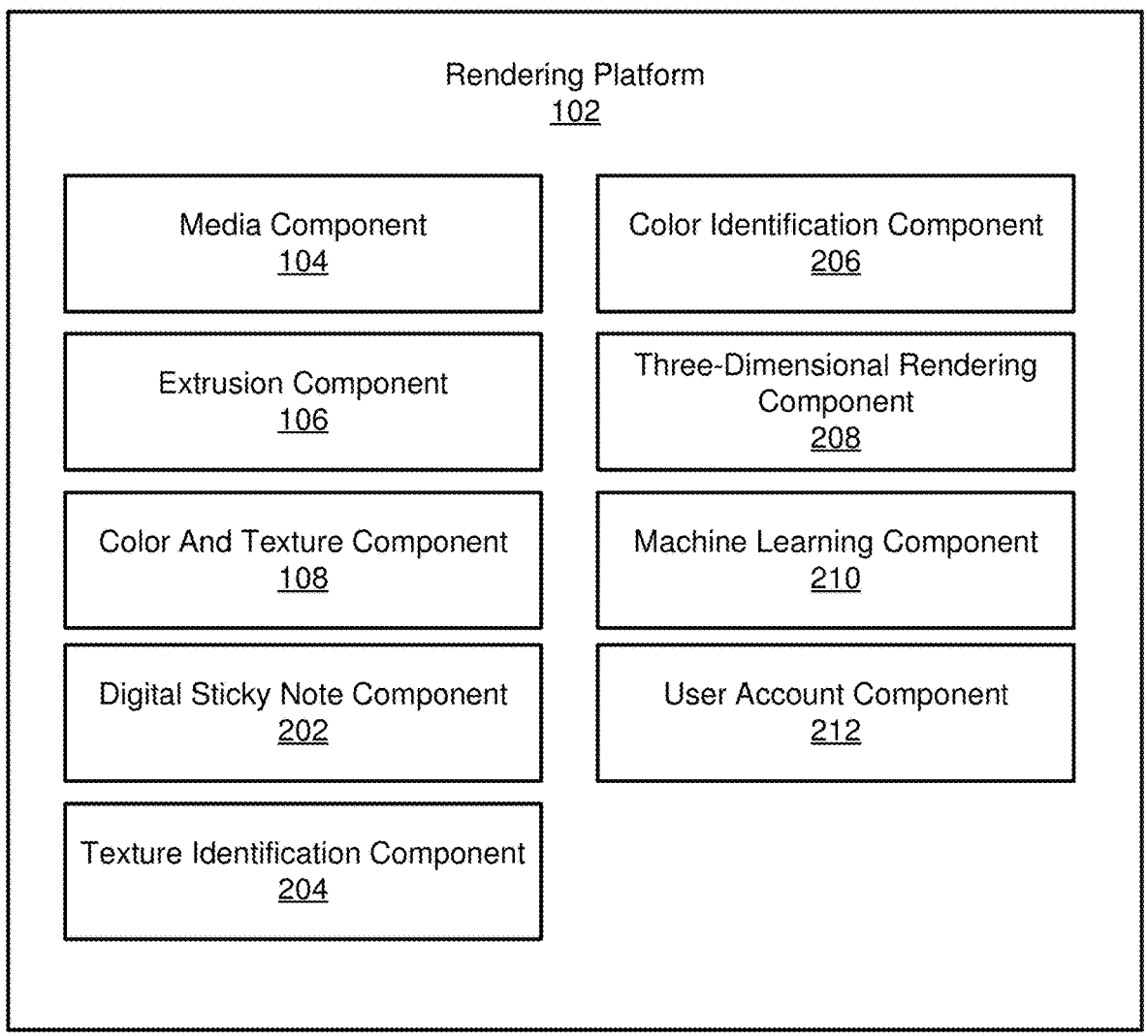
FIG. 2 is a schematic block diagram comprising illustrative components of a rendering platform.

FIG. 2 is a block diagram of the rendering platform 102. The rendering platform 102 includes the media component 104, the extrusion component 106, and the color and texture component 108 as discussed in FIG. 1. The rendering platform 102 may further include one or more of a digital sticky note component 212, a texture identification component 204, a color identification component 206, a three-dimensional rendering component 208, and a machine learning component 210.

For purposes of illustration, programs and other executable program components are shown herein as discrete blocks, although it is understood that such programs and components may reside at various times in different storage components of a computing device and are executed by one or more processors. Alternatively, the systems and procedures described herein can be implemented in hardware, or a combination of hardware, software, and/or firmware. For example, one or more application specific integrated circuits (ASICs) can be programmed to carry out one or more of the systems and procedures described herein. As used herein, the term "component" is intended to convey the implementation apparatus for accomplishing a process, such as by hardware, or a combination of hardware, software, and/or firmware, for the purposes of performing all or parts of operations disclosed herein. The terms "component" is intended to convey independence in how the modules, components, or their functionality or hardware may be implemented in different embodiments.

The digital sticky note component 202 stores and represents digital sticky notes on two-dimensional media, three-dimensional media, and/or an interactive rendering. The digital sticky note component 202 may store and represent a digital sticky note in connection with any suitable media, including, for example, images, video streams, web pages, documents, spreadsheets, maps, interactive renderings, three-dimensional models, and so forth. The digital sticky note component 202 need not apply to only residential or commercial construction and/or landscaping projects and has application in numerous other industries. The digital sticky note component 202 generates a "digital sticky note" that serves as a digital representation of a graphical shape or object that is attached to a certain location on an image, photograph, video stream, real-time three-dimensional editor, and so forth. The digital sticky note comprising a location indicator relative to pertinent media, such as the image, photograph, video stream, and/or real-time three-dimensional editor. The digital sticky is movable by a user by way of a user interface. Additionally, in an embodiment, the rendering server and/or a neural network associated with the rendering server 110 generates a suggestion to place the digital sticky note at a certain location. The digital sticky note comprises information and data received from a user. This information and data may comprise manually-input parameters and preferences, media such as images, hyperlinks, video streams, and so forth, and/or information applicable to the location of the digital sticky note. In an embodiment, the digital sticky note comprises real-world location data such as global positioning system (GPS) coordinates.

As discussed herein, a "digital sticky note" is a digital object that provides a means for associating data with a file. Specifically, the digital sticky note may associate data with a certain coordinate location within the file. In an embodiment, a digital sticky note is a digital representation of an icon, image, or other object, and the digital sticky note may be displayed at a certain coordinate location within a file. The file may include any suitable media, including, for example, an image, a video stream, a document, a spreadsheet, a web page, an interactive rendering, a three-dimensional model, a map, and so forth. In an embodiment, a plurality of different types of data may be aggregated and stored in connection with the digital sticky note. Any suitable data may be stored in connection with the digital sticky note including, for example, images, video streams, web pages, hyperlinks, documents, spreadsheets, budgets, maps, notes, social media profiles, inspiration boards, search engine results, communication logs, and so forth.

In an example, a digital sticky note is applied to a three-dimensional rendering of a user's kitchen. The user manually creates the digital sticky note and places the digital sticky note on the countertop of the countertop in the three-dimensional rendering. The user uploads an image of an exemplary kitchen with the same countertop desired by user. The user may indicate that the countertop in the uploaded image should be replicated and applied to the countertop in the three-dimensional rendering. The user may upload a plurality of media comprising different possible ideas, exemplary designs, products, and so forth. The user may attach notes or thoughts to the digital sticky note to remind the user in the future of the thought process or progress in designing the countertop. In an embodiment, multiple users may view and edit the digital sticky note to coordinate with one another.

The texture identification component 204 is configured to identify a texture or type of material shown in media. In an embodiment, the texture identification component 204 comprises a neural network trained for image recognition to identify textures, colors, material types, and so forth illustrated within media. The texture identification component 204 may be configured to identify and retrieve a texture file from the texture database 126. The texture file may include a plurality of layers, wherein the combination of the plurality of layers creates a final texture appearance. For example, a texture file for hardwood flooring may comprise pattern information for a single slat of hardwood flooring and may additionally comprise information for implementing multiple slats of hardwood flooring on to a three-dimensional rendering.

In an example implementation, a user uploads an image of an exemplary kitchen and indicates that the backsplash tile in the exemplary kitchen should be applied to the user's personalized three-dimensional rendering of the user's own kitchen. The texture identification component 204 may provide the image to a neural network trained to locate the backsplash tile in the image. The same neural network or an additional neural network may be trained to identify the backsplash tile or identify a close approximation to the backsplash tile. After the backsplash tile has been identified or approximated, the texture identification component 204 may retrieve from memory the same tile texture and/or an approximated tile texture that is stored in the texture database 126. In an example, the tile in the exemplary kitchen is a white subway tile of a certain size. The texture identification component 204 is configured to locate the tile in the image of the exemplary kitchen, determine the tile is a white subway tile, and determine a size of the subway tile. The texture identification component 204 may additionally be configured to scan the user database 124 to retrieve a texture file corresponding with subway tile of the same size or a similar size. The texture file may be applied to the user's personalized three-dimensional rendering of the user's own kitchen.

The color identification component 206 is configured to identify a color shown in media. In an embodiment, the color identification component 206 comprises a neural network trained for image recognition to identify textures, colors, material types, and so forth illustrated within media. The color identification component 206 may be configured to locate a certain material within media uploaded by the user. The uploaded media may include images, photographs, video streams, hyperlinks, available products, product SKUs, and so forth. The color identification component 206 may comprise a neural network trained to locate a certain material or object within the media. In an example implementation, the color identification component 206 is trained to locate the cabinets in an image of an exemplary kitchen. The color identification component 206 is additionally configured to identify the color of a certain object in the media. In the example implementation, the color identification component 206 may be configured to identify the color of the cabinets in the image of the exemplary kitchen.

The color identification component 206 may additionally be configured to approximate the color of a certain structure or object within media. Further to the example implementation discussed above, the color identification component 206 may be tasked with identifying the color of cabinets within an image of an exemplary kitchen. However, based on the quality of the image and the lighting of the cabinets, the color of the cabinets might not be consistent throughout the image. The color identification component 206 may be configured to take an "average" color of the cabinets that most likely represents the color of the cabinets in real-life.

The three-dimensional rendering component 208 is configured to create a three-dimensional rendering of a space. The three-dimensional rendering component 208 may create the three-dimensional rendering using the serialized data (see 314 at FIG. 3) output by the extrusion algorithm (see 310 at FIG. 3). The serialized data 314 may include a geometric vector diagram indicating the (x,y,z) coordinates of walls, windows, doors, and other structures in a floorplan. In an alternative embodiment, the geometric vector diagram may include the (x,y,z) coordinates of hardscaping, trees, plants, retaining walls, lawn, and so forth in a landscaping design. The three-dimensional rendering component 208 is configured to create an interactive and personalized three-dimensional rendering of a space based on an input two-dimensional drawing of the space.

In an embodiment, the three-dimensional rendering component 208 provides the serialized data 314 output from the extrusion algorithm 310 to an external service configured to create the three-dimensional rendering. In such an embodiment, the three-dimensional rendering component 208 may be configured to convert the serialized data 314 into a certain file-type that can be used by an external program.

The three-dimensional rendering is a three-dimensional model comprising individual geometric elements. The three-dimensional model is interactive in real-time and can be amended by a user by way of the rendering platform 102. The three-dimensional rendering may additionally include rendered images at different angles to illustrate additional view and details of the space. The three-dimensional rendering may be viewed with virtual reality or augmented reality modes.

The machine learning component 210 is configured to improve operations of the rendering platform 102 by analyzing past inputs, outputs, and issues experienced by the rendering server 110 during operation of the rendering platform 102. Additionally, the machine learning component 210 is configured to analyze media provided by a user to locate certain objects within the media, identify certain objects, materials, colors, textures, or surfaces within the media, and so forth. The machine learning component 210 may comprise one or more neural networks configured for different tasks and trained with different sets. The machine learning component 210 may comprise one or more of a radial basis forward (RBF) network, a deep feed forward (DFF) network, a recurrent neural network (RNN), a long/short term memory (LTSM) network, a gated recurrent unit (GRU) network, an autoencoder (AE) network, a variational autoencoder (VAE) network, a denoising autoencoder (DAE) network, a sparse autoencoder (SAE) network, a deep belief network (DBN), a deep convolutional network (DCN), a deconvolutional network (DN), a deep convolutional inverse graphics network (DCIGN), a generative adversarial network (GAN), a liquid state machine (LSM), an extreme learning machine (ELM), an echo state network (ESN), a deep residual network (DRN), a support vector machine (SVM), a neural Turing machine (NTM), and so forth. The type of neural network deployed by the machine learning component 210 may be selected based on the type of task to be executed by the machine learning component 210. Any suitable neural network may be used depending on the type of task to be executed and the efficiency of the neural network in executing that task.

The user account component 212 stores information pertaining to a user's account with the rendering platform 102. The user account component 212 may prompt the user to enter personal information or to create an account with the rendering platform 102. The user account component 212 may store information about data that has been uploaded, saved, or notated to the user account by the user or some other party. In an embodiment, a user creates a user account when engaging with the rendering platform 102 and that user account information is stored on the user database 124 in communication with the rendering server 110. The user may login to the user account by way of an Internet connection.

Figure 3:
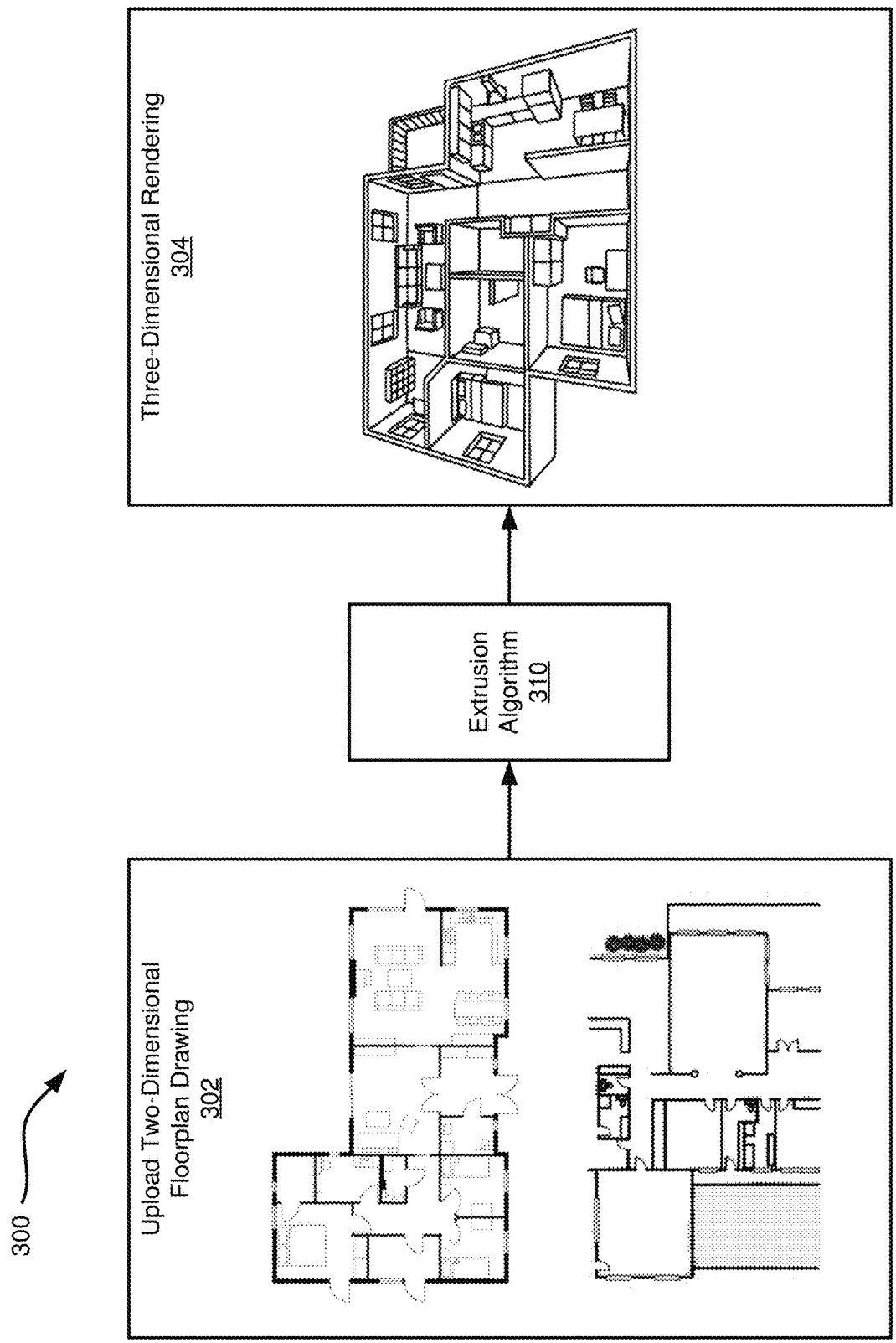
FIG. 3 is a process flow illustrating a two-dimensional floorplan input that can be processed by an extrusion algorithm to generate a three-dimensional rendering.

FIG. 3 illustrates a process flow 300 for inputting a floorplan drawing into an extrusion algorithm 310 to generate a vector diagram comprising serialized data. The serialized data output of the extrusion algorithm 310 can be used to generate a three-dimensional rendering 304 that represents the floorplan drawing. In an embodiment, a user uploads at 302 a two-dimensional floorplan drawing. The user may upload this drawing to the rendering server 110 by accessing a user interface for the rendering platform 102. The two-dimensional floorplan drawing is stored in the user database 124 and may be processed by one or more processors executing the extrusion algorithm 310. The output of the extrusion algorithm 310 is a vector map that can be used to generate a three-dimensional rendering 304 of the floorplan drawing.

Figure 4:
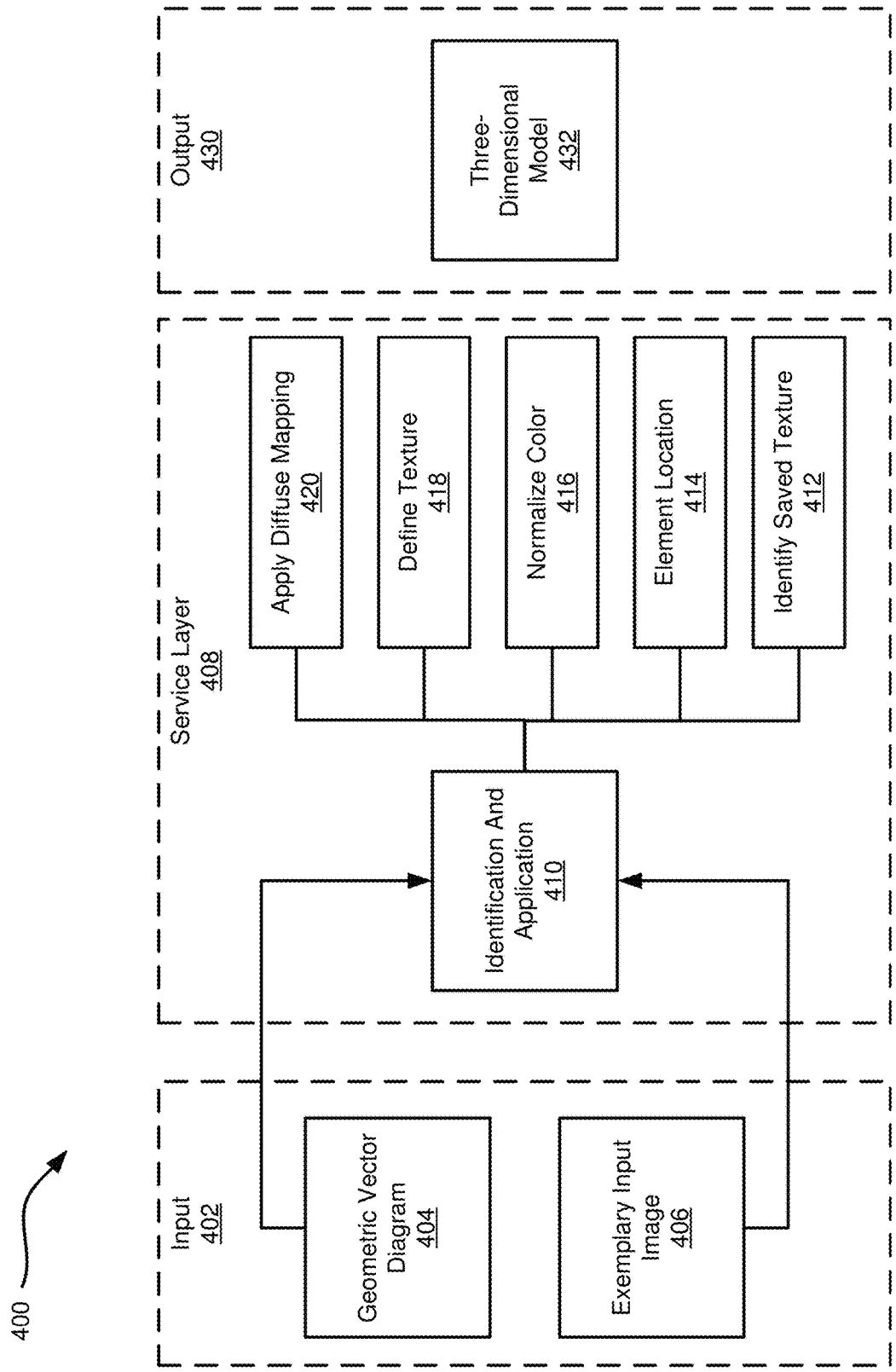
FIG. 4 is a schematic diagram of a process flow generating a color and texture placement that can be applied to a rendered model of a space.

FIG. 4 is a schematic flow chart diagram of a process flow 400 for generating a three-dimensional rendering 304 based on the output of an extrusion algorithm 310. The input 402 of the process flow 400 includes a geometric vector diagram 404 and/or an exemplary input image 406. The rendering is completed by a service layer 408 that executes the identification and application 410 algorithm. The process of identification and application 410 includes identifying a saved texture at 412 and identifying an element location at 414 for applying a texture to a three-dimensional model 432. The identification and application 410 process further includes normalizing the color at 416 for the texture and defining the texture at 418. The identification and application 410 process includes applying diffuse mapping at 420. The service layer 408 executes the identification and application 410 algorithm to generate a three-dimensional model 432 of a space that comprises personalized color and texture modeling.

The geometric vector diagram 404 is an output of the extrusion algorithm 310. In an embodiment where the process flow 400 is applied to an architectural or construction design, the geometric vector diagram 404 comprises serialized data indicating where walls, cabinets, doors, windows, and other structures in a space are located. In an embodiment where the process flow 400 is applied to a landscaping design, the geometric vector diagram 404 may comprise indications of where hardscaping, pathways, retaining walls, trees, fences, plants, and other elements are located within a landscaping design. The geometric vector diagram 404 may be saved in any suitable file format that may be used by other third-party rendering programs.

The exemplary input image 406 is an image or other media uploaded by a user comprising an exemplary design or material selection. The exemplary input image 406 may comprise one or more of an image, a photograph personally captured by a user, an available product, a product SKU, a note or preference manually input by a user, a video stream, a hyperlink to an image or other media, and/or an output from a machine learning algorithm trained to predict user preferences. The exemplary input image 406 comprises one or more elements to be applied to the three-dimensional model 432. In an example implementation, the exemplary input image 406 is an image of a kitchen, and the user has indicated that the backsplash in the example kitchen should be applied to the three-dimensional model 432. The user may further indicate that the size/scale of the backsplash, the texture of the backsplash, and/or the color of the backsplash in the exemplary input image 406 should be modified when generating the three-dimensional model 432.

The service layer 408 is a processing layer of the rendering server 110. The service layer 408 may run independently of other layers in the rendering server 110. The service layer 408 comprises one or more processors for executing an identification and application 410 algorithm or applying colors, textures, and other preferences to a three-dimensional model 432 of a space. The identification and application 410 algorithm comprises at least five steps, including identifying a saved texture at 412, identifying an element location at 414, normalizing a preferred color at 416, defining an applicable texture at 418, and applying diffuse mapping at 410.

The process of identifying a saved texture at 412 comprises locating and retrieving an applicable texture saved in the texture database 126. The process of identifying a saved texture 412 may further include analyzing the exemplary input image 406 to locate an applicable structure, construction material, furnishing, and so forth. Examples include tile, flooring, countertops, furnishings, plumbing fixtures, lighting fixtures, cabinets, wall textures, and so forth. This process may be executed by a neural network trained to locate a certain structure or object within an image. The neural network may be trained to distinguish countertops from backsplash or flooring, for example, and provide an indication of where the applicable structure or object is located within the exemplary input image 406. The process of identifying a saved texture at 412 may further include analyzing the structure or object within the exemplary input image 406 to determine what type of texture it has. This process may be executed by a neural network trained to differentiate, for example, different types of tile, different types of countertop surfaces, different types of cabinets, and so forth.

The process of defining an element location at 414 comprises identifying a location within the geometric vector diagram 404 and/or the three-dimensional model 432 where a certain color, texture, structure, or object should be applied. This may be done at least in part based on a manual input from a user indicating where the color, texture, structure, or object should be applied.

The process of normalizing a color at 416 comprises identifying a color within the exemplary input image 406. In an embodiment, a user provides a manual input comprising a color code, for example an RGB or HEX# color identifier. In an embodiment, a user provides a manual input by using an "eyedropper" tool to identify a specific color within the exemplary input image 406. The user implements the eyedropper tool by hovering over a certain element within the exemplary input image 406. The eyedropper normalizes all pixels within its magnifier into one color identified by an RGB or HEX# color identifier.

In an embodiment, the normalizing a color 416 process is performed automatically rather than receiving a manual input from a user. In the automated process, a neural network identifies an object within the exemplary input image 406 (for example, a countertop, cabinet, flooring, etc.) and generates a normalized color for that object. The normalizing color 416 process may additionally include generating a complete texture file and/or diffuse map to represent the object in the exemplary input image 406. In some implementations, based on the quality and lighting of the exemplary input image 406, a structure within the exemplary input image 406 might not have a consistent color throughout. The process of normalizing the color at 416 includes identifying an "average" color for a certain structure within the exemplary input image 406. For example, this process may include defining the "average" shade of blue across a bank of cabinets within the exemplary input image 406, and then selecting that average shade of blue to be applied to the three-dimensional model 432.

The process of defining a texture at 418 comprises locating and retrieving an applicable texture saved in the texture database 126. The process of identifying a saved texture 412 may further include analyzing the exemplary input image 406 to locate an applicable structure, construction material, furnishing, and so forth. Examples include tile, flooring, countertops, furnishings, plumbing fixtures, lighting fixtures, cabinets, wall textures, and so forth. This process may be executed by a neural network trained to locate a certain structure or object within an image. The neural network may be trained to distinguish countertops from backsplash or flooring, for example, and provide an indication of where the applicable structure or object is located within the exemplary input image 406. The process of identifying a saved texture at 412 may further include analyzing the structure or object within the exemplary input image 406 to determine what type of texture it has. This process may be executed by a neural network trained to differentiate, for example, different types of tile, different types of countertop surfaces, different types of cabinets, and so forth.

In an embodiment, the process of defining a texture at 418 includes drawing or creating a new texture rather than retrieving a stored texture from the texture database 126. In an embodiment, this is executed by a neural network trained to draw textures and layouts of textures based on an exemplary input image 406.

The process of applying diffuse mapping at 420 comprises applying a texture file to a rendering. In an embodiment, a texture file is retrieved from the texture database 126, and the texture file comprises a plurality of layers for applying the texture to a three-dimensional rendering, two-dimensional image, and so forth. A diffuse map is a texture map that may define one or more of the color, pattern, and repeating of an object. The process of applying diffuse mapping at 420 may be analogized to painting an image (i.e., the texture file) on to the surface of an object (e.g., a cabinet, wall, floor, or other object within a rendering).

Figure 5:
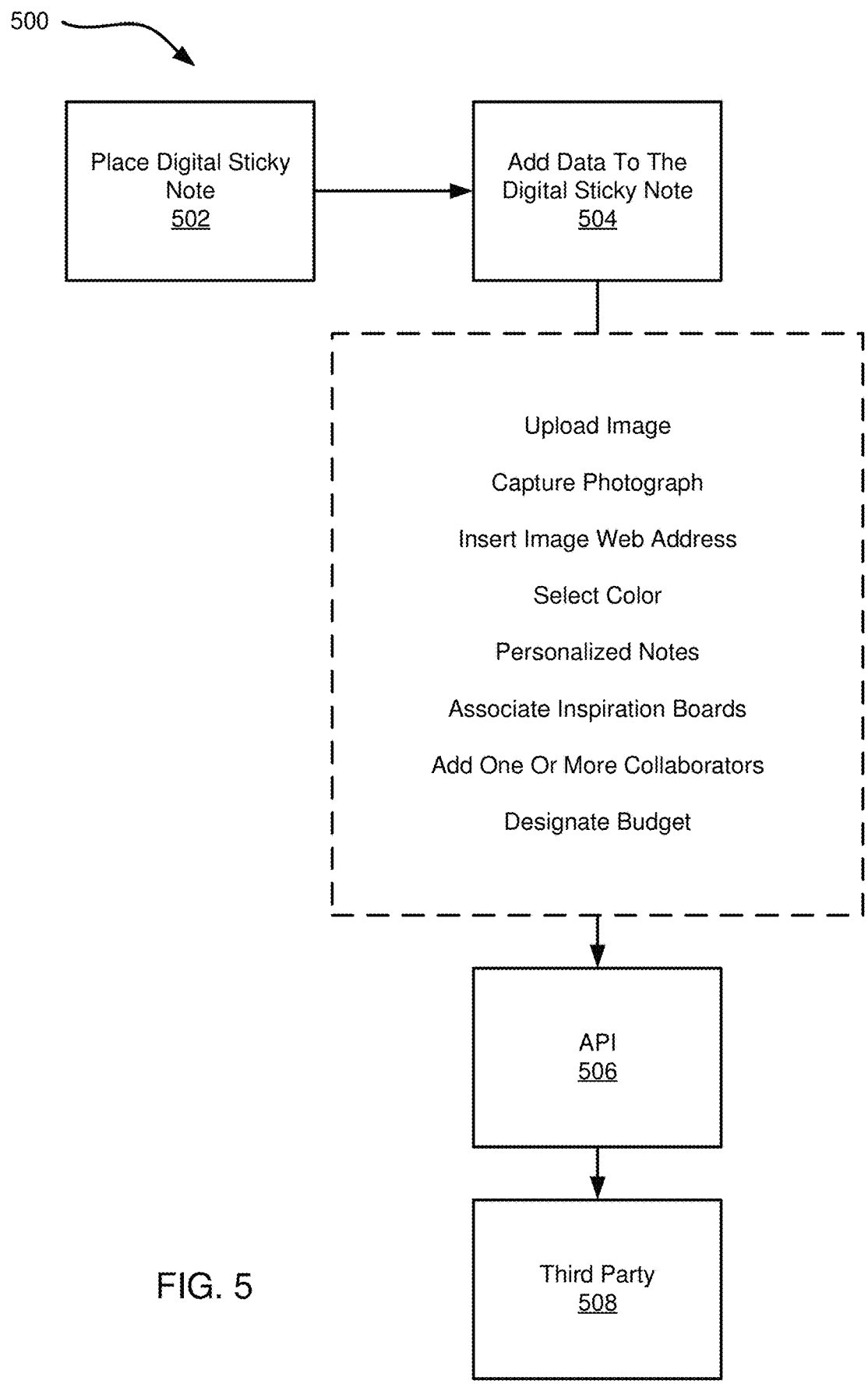
FIG. 5 is a schematic diagram of a process flow for generating and applying a digital sticky note to a media file or rendering of a space.

FIG. 5 is a schematic diagram of a process flow 500 for placing a digital sticky note on an interactive rendering of a space. The process flow 500 includes placing a digital sticky note at 502 and adding data to the digital sticky note at 504. The digital sticky note may include any suitable data depending on the application, including, for example, an uploaded image, a photograph captured by a user, a web address for an image, a color, personalized notes, online-accessible inspiration boards, inspiration board documents, and budgets. Additionally, one or more collaborators may be granted permission to read and/or write to the digital sticky note. The process flow 500 includes connecting the digital sticky note to an application program interface (API) at 506. The process flow 500 includes providing access to the digital sticky note to a third party at 508. It should be appreciated that the steps of the process flow 500 illustrated in FIG. 5 may be performed in any suitable order, and that various steps may be performed a plurality of times.

The process of placing the digital sticky note at 502 includes receiving an input from a user, rules-based algorithm, and/or neural network. In an embodiment, a user manually creates a digital sticky note and places the digital sticky on a specific location within an interactive rendering, an image, a media file, and/or attaches the digital sticky note to a geographic location. The location where the digital sticky note is placed may be referred to herein as a "coordinate location" for the digital sticky note. The coordinate location may comprise x, y, z coordinates for where the digital sticky note should be displayed within the media file, such as an interactive rendering, image, video stream, and so forth. In an embodiment, a rules-based algorithm or neural network provides a suggested coordinate location for where a digital sticky note should be placed based on the type of document, the type of project, the preferences of a user, and so forth. The digital sticky note may be secured to a digital document, such as an image, a video stream, an interactive rendering of a space, a hand-drawn diagram of a space, a computer-rendered diagram of a space, and so forth. The digital sticky note may be visible or hidden within the document.

In an example implementation, a three-dimensional, interactive rendering of a user's kitchen is created by the rendering server 110. The rendering platform 102 provides a means for a user to create a digital sticky note and place the digital sticky note on a structure, fixture, surface, or other portion of the three-dimensional rendering. In an example, the user creates a digital sticky note and places it on the cabinets of the three-dimensional rendering. The user may add information to the digital sticky note to indicate the user's preferences for the cabinets. Additionally, the user may include information indicating how the three-dimensional rendering should be modified to include certain cabinet configurations, colors, textures, and so forth.

The process of adding data to the digital sticky note at 504 includes receiving information manually input by a user and/or receiving information suggested by a neural network or other algorithm. In an embodiment, a user creates a digital sticky note, places the digital sticky note, and adds information to be stored in connection with the digital sticky note. Information may include, for example, an image uploaded by the user, an image captured by the user in real-time with a mobile computing device, a web address to an image or other media, a video stream, and so forth. Additionally, the user may select a color using an eyedropper technique, may manually input a universal code for a color, may select a color off a color wheel, and so forth. The user may indicate that the location where the digital sticky note is placed should be flood filled with the selected color. Additionally, the user may include personalized notes indicating, for example, the user's through process, preferences, budgets, ideas, and so forth applicable to the location of the digital sticky note. Additionally, the user may associate the digital sticky note with one or more inspiration boards, including web-based inspiration boards and hard-copy documents of inspiration boards. Additionally, the user may grant read and/or write access to one or more collaborators to also interact with the digital sticky note. Additionally, the user may designate a budget for the structures, items, or fixtures associated with the digital sticky note. The user may designate an upper budget limit, an amount of money and/or time that has already been spent, a budget range, a detailed budget for different aspects of a project, and so forth.

In an embodiment, the process of adding data to the digital sticky note at 504 includes receiving suggested data from a neural network or other algorithm. In an embodiment, a neural network is trained to predict a user's taste based on one or more of the user's manually-input preference, the user's inspiration boards, the user's purchase history, the user's search history, the user's "favorite" history, the user's location, the user's demographics, and so forth. The neural network may be trained to generate suggested designs, products, colors, and textures based on the user's preferences.

For example, a user may attach the digital sticky note to a shower space within a rendering of a residential bathroom. The neural network may suggest tile, plumbing hardware, textiles, and so forth that the user may like to use in the shower space of the bathroom. Additionally, the neural network may suggest products that could be purchased by the user, contractors in the user's area that could assist in the project, and so forth. The user may accept or deny the suggestions presented by the neural network. The user's choices to accept or deny the neural network's suggestions are fed back into the neural network and used to further define the user's preferences for future projects and suggestions.

In an embodiment, the digital sticky note is connected to one or more APIs. In an example implementation, the digital sticky note is connected to a payment portal API that permits a user to directly purchase a product through the digital sticky note. The digital sticky note may be connected to an API that enables a user to send and receive data elements to the rendering server 110 or other parties. In an embodiment, the digital sticky note represents a unique coded "ecosystem." When an API is connected to the digital sticky note, the API represents an open lane of communication between the digital sticky note and other systems. In an embodiment, the API enables the transmission and receipt of data between the digital sticky note and external or internal data visualization dashboards. In an embodiment, the API enables the transmission and receipt of payment data with an outside party.

The process of providing access to the digital sticky note to a third party at 508 includes connecting the digital sticky note with an API comprising a payment processing platform. In an example implementation, the digital sticky note comprises an API for providing immediate shopping and payment processing capabilities without vendors, retailers, manufacturers, and other entities.

Figure 6:
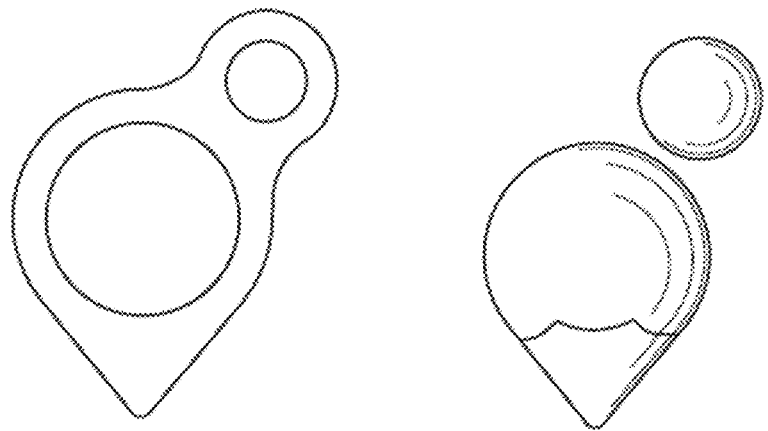
FIG. 6 illustrate two possible embodiments of a digital sticky note.

FIG. 6 illustrates two exemplary configurations for a digital sticky note. It should be appreciated that the digital sticky note may take any suitable form, and that the forms illustrated in FIG. 6 are only exemplary. The digital sticky note may include any image, icon, text, or other digital indication that can be placed on a digital document such as an image, interactive model or rendering, video stream, and so forth. The digital sticky note may be hidden or may remain visible at all times. In an embodiment, a user may tap, click, or otherwise select the digital sticky note to then see additional information stored in connection with the digital sticky note.

Figure 7:
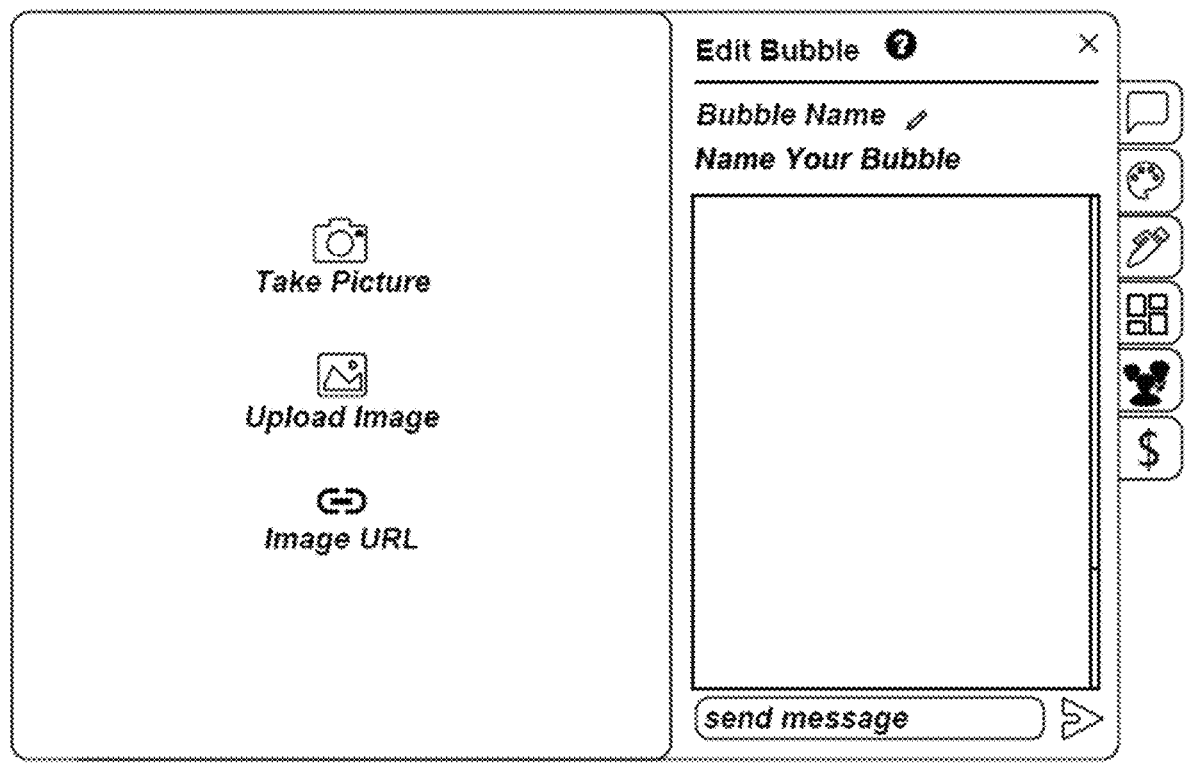
FIG. 7 is a screen shot of an exemplary information box associated with a digital sticky note.

FIG. 7 is a screenshot of an exemplary sticky note portal. The sticky note portal may be visible to a user in response to a user clicking, tapping, creating, or otherwise selecting a digital sticky note. The portal enables a user to take a picture in real-time to add to the digital sticky note, to upload an image, to connect the digital sticky note with the web address of an image, and so forth. The user may additionally attach a name, description, background information, budget, and so forth to the digital sticky note.

Figure 8B:
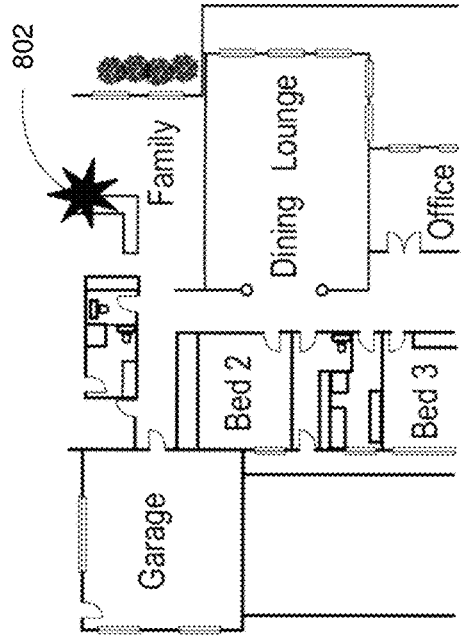
FIGS. 8A-8D illustrate applications of adhering a digital sticky note to an image or rendering of a space.
Figure 8D:
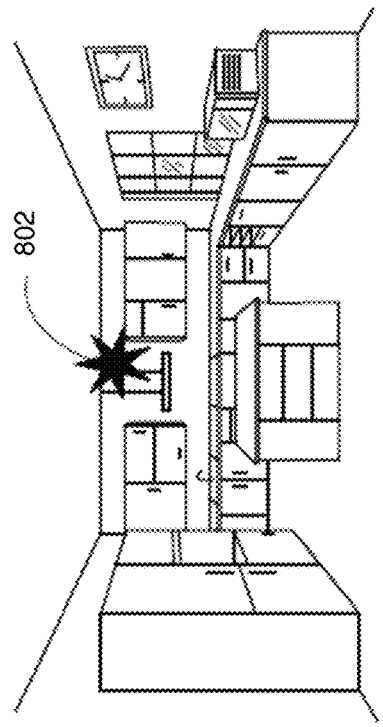
Figure 8A:
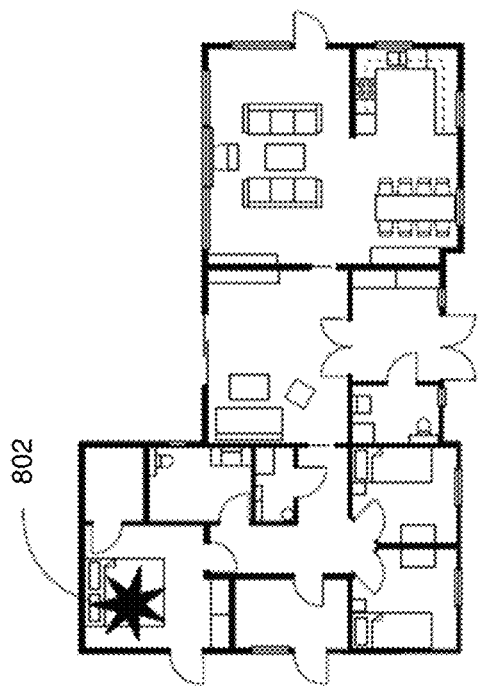
Figure 8C:
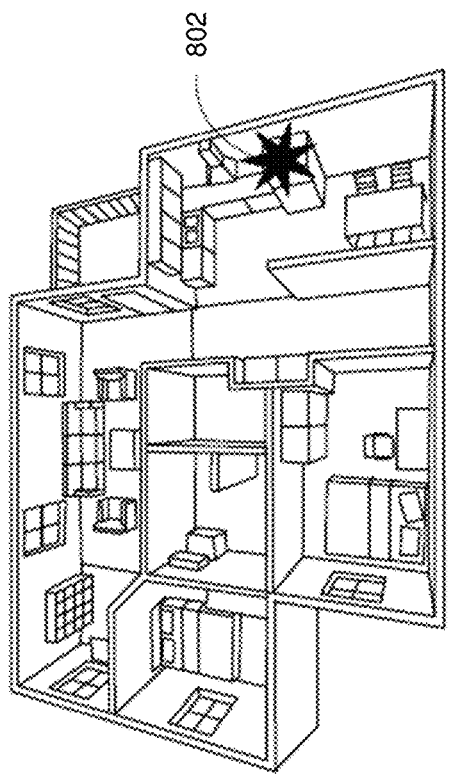

FIGS. 8A-8D illustrate exemplary implementations of a digital sticky note 802 on different files. FIG. 8A illustrates an example where a digital sticky note 802 has been adhered to a bedroom within a two-dimensional computer-generated drawing of an architectural floorplan. FIG. 8B illustrates an example where a digital sticky note 802 has been adhered to cabinets within a kitchen of a hand-drawn drawing of an architectural floorplan. FIG. 8C illustrates an example where a digital sticky note 802 has been adhered to cabinets and appliances within a kitchen of a three-dimensional rendering of an architectural floorplan. FIG. 8D illustrates an example where a digital sticky note 802 has been adhered to an appliance of a kitchen in an image of the kitchen. The digital sticky note 802 may be adhered to any suitable location within a media file. Multiple digital sticky notes 802 may be adhered to different locations within the media file and/or at the same location within the media file.

In the example illustrated in FIG. 8A, a user may upload the two-dimensional drawing of the user's floorplan and adhere a digital sticky note to the bedroom in the floorplan. The user may then use the digital sticky note 802 to store inspiration boards, inspiration images, potential products, budgets, and so forth applicable to the user's bedroom.

In the example illustrated in FIG. 8B, a user may upload the hand-drawn drawing of the user's floorplan and adhere a digital sticky note 802 to the cabinets in the user's kitchen. The user may use the digital sticky note 802 to store information about the user's kitchen cabinets or overall kitchen design.

In an embodiment, the digital sticky note includes geographic location information. The digital sticky note may be used by persons to store information in connection with a geographic location. For example, a person may create a digital sticky note at a certain geographic location, capture an image at that geographic location, and send the digital sticky note to a government agency or other entity. This could be used to identify a problem or broken infrastructure at the geographic location, an activity that occurred at the geographic location, an event occurring at the geographic location, and so forth. A collection of digital sticky notes for a corporation, religious organization, government organization, city, town, group of persons, or other entity may be stored such that all digital sticky notes include geographic information in connection with additional images, text, or other data. In an embodiment, a map displays digital sticky notes that have been created across a geographic region, and each of the digital sticky notes may be opened to receive more information about the event, accident, issue, structures, and so forth located at the geographic location.

It should be appreciated that the digital sticky note 802 has many uses outside of architectural design, remodeling design, and/or landscaping design. The exemplary implementations discussed herein are non-limiting, and the digital sticky note 802 is applicable to any suitable implementation.

Figure 9:
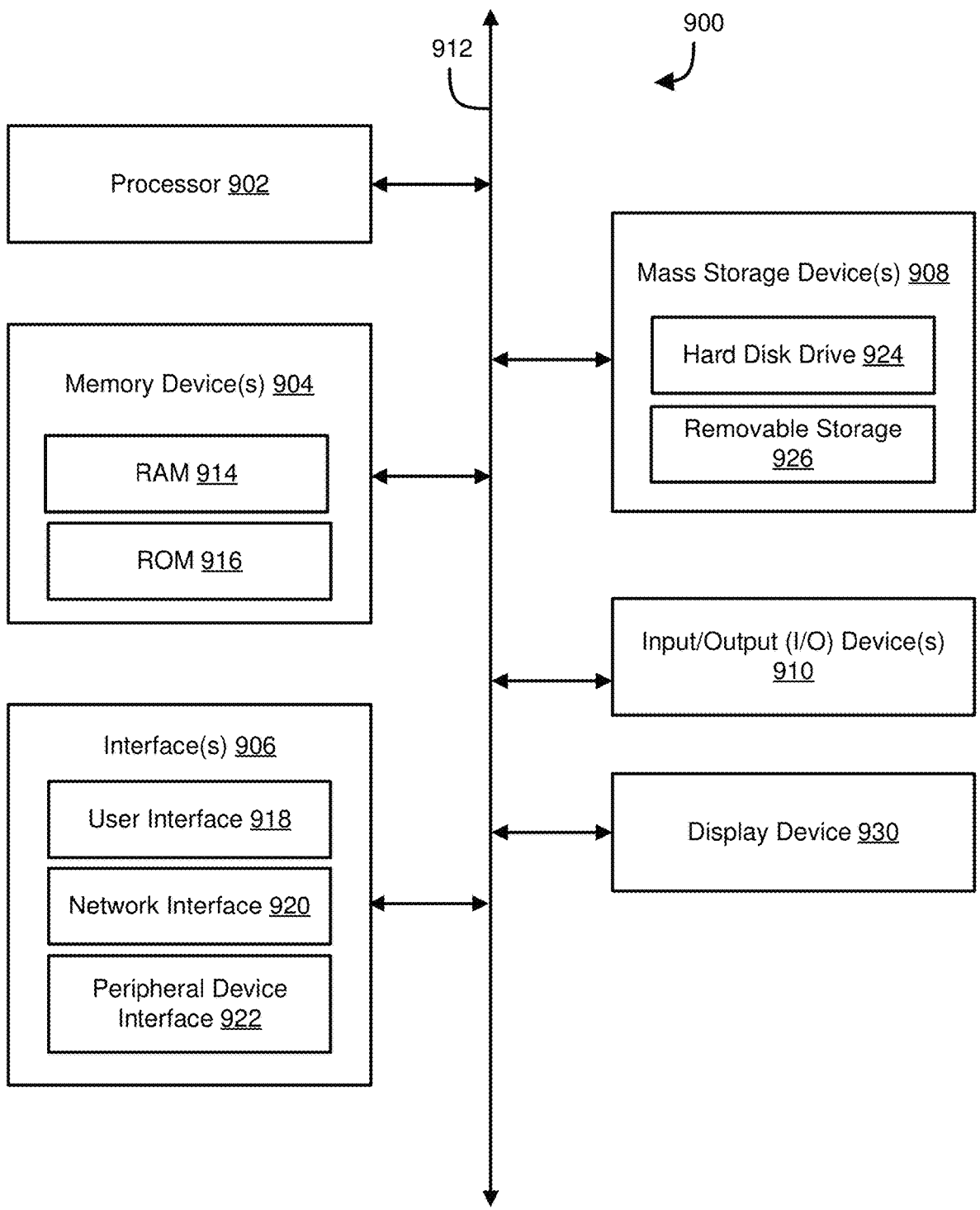
FIG. 9 is a schematic block diagram of an example computing system according to an example embodiment of the systems and methods described herein.

Referring now to FIG. 9, a block diagram of an example computing device 900 is illustrated. Computing device 900 may be used to perform various procedures, such as those discussed herein. Computing device 900 can perform various monitoring functions as discussed herein, and can execute one or more application programs, such as the application programs or functionality described herein. Computing device 900 can be any of a wide variety of computing devices, such as a desktop computer, in-dash computer, vehicle control system, a notebook computer, a server computer, a handheld computer, tablet computer and the like.

Computing device 900 includes one or more processor(s) 912, one or more memory device(s) 904, one or more interface(s) 906, one or more mass storage device(s) 908, one or more Input/output (I/O) device(s) 910, and a display device 930 all of which are coupled to a bus 912. Processor(s) 912 include one or more processors or controllers that execute instructions stored in memory device(s) 904 and/or mass storage device(s) 908. Processor(s) 912 may also include various types of computer-readable media, such as cache memory.

Memory device(s) 904 include various computer-readable media, such as volatile memory (e.g., random access memory (RAM) 914) and/or nonvolatile memory (e.g., read-only memory (ROM) 916). Memory device(s) 904 may also include rewritable ROM, such as Flash memory.

Mass storage device(s) 908 include various computer readable media, such as magnetic tapes, magnetic disks, optical disks, solid-state memory (e.g., Flash memory), and so forth. As shown in FIG. 9, a particular mass storage device 908 is a hard disk drive 924. Various drives may also be included in mass storage device(s) 908 to enable reading from and/or writing to the various computer readable media. Mass storage device(s) 908 include removable media 926 and/or non-removable media.

I/O device(s) 910 include various devices that allow data and/or other information to be input to or retrieved from computing device 900. Example I/O device(s) 910 include cursor control devices, keyboards, keypads, microphones, monitors, touchscreen devices, or other display devices, speakers, printers, network interface cards, modems, and the like.

Display device 930 includes any type of device capable of displaying information to one or more users of computing device 900. Examples of display device 930 include a monitor, display terminal, video projection device, and the like.

Interface(s) 906 include various interfaces that allow computing device 900 to interact with other systems, devices, or computing environments. Example interface(s) 906 may include any number of different network interfaces 920, such as interfaces to local area networks (LANs), wide area networks (WANs), wireless networks, and the Internet. Other interface(s) include user interface 918 and peripheral device interface 922. The interface(s) 906 may also include one or more user interface elements 918. The interface(s) 906 may also include one or more peripheral interfaces such as interfaces for printers, pointing devices (mice, track pad, or any suitable user interface now known to those of ordinary skill in the field, or later discovered), keyboards, and the like.

Bus 912 allows processor(s) 912, memory device(s) 904, interface(s) 906, mass storage device(s) 908, and I/O device(s) 910 to communicate with one another, as well as other devices or components coupled to bus 912. Bus 912 represents one or more of several types of bus structures, such as a system bus, PCI bus, IEEE bus, USB bus, and so forth.

For purposes of illustration, programs and other executable program components are shown herein as discrete blocks, although it is understood that such programs and components may reside at various times in different storage components of computing device 1800 and are executed by processor(s) 912. Alternatively, the systems and procedures described herein can be implemented in hardware, or a combination of hardware, software, and/or firmware. For example, one or more application specific integrated circuits (ASICs) can be programmed to carry out one or more of the systems and procedures described herein. As used herein, the terms "module" or "component" are intended to convey the implementation apparatus for accomplishing a process, such as by hardware, or a combination of hardware, software, and/or firmware, for the purposes of performing all or parts of operations disclosed herein. The terms "module" or "component" are intended to convey independent in how the modules, components, or their functionality or hardware may be implemented in different embodiments.

Various techniques, or certain aspects or portions thereof, may take the form of program code (i.e., instructions) embodied in tangible media, such as floppy diskettes, CD-ROMs, hard drives, a non-transitory computer readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and non-volatile memory and/or storage elements), at least one input device, and at least one output device. The volatile and non-volatile memory and/or storage elements may be a RAM, an EPROM, a flash drive, an optical drive, a magnetic hard drive, or another medium for storing electronic data. One or more programs that may implement or utilize the various techniques described herein may use an application programming interface (API), reusable controls, and the like. Such programs may be implemented in a high-level procedural, functional, object-oriented programming language to communicate with a computer system. However, the program(s) may be implemented in assembly or machine language, if desired. In any case, the language may be a compiled or interpreted language, and combined with hardware implementations.

It should be understood that many of the functional units described in this specification may be implemented as one or more components or modules, which are terms used to emphasize their implementation independence more particularly. For example, a component or module may be implemented as a hardware circuit comprising custom very large-scale integration (VLSI) circuits or gate arrays, off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components and may be embodied in any suitable form and organized within any suitable type of data structure. The operational data may be collected as a single data set or may be distributed over different locations including over different storage devices, and may exist, at least partially, merely as electronic signals on a system or network. The components may be passive or active, including agents operable to perform desired functions.

EXAMPLES

The following examples pertain to further embodiments.

Example 1 is a method. The method includes receiving an image comprising an object and receiving an indication of a color. The method includes identifying the object within the image and defining a texture of the object. The method includes selecting a stored texture file stored in a database based on the texture of the object. The method includes merging the stored texture file and the color to generate a color and texture placement that can be implemented in a rendered scene.

Example 2 is a method as in Example 1, further comprising: generating a three-dimensional model of a scene; identifying an object within the three-dimensional on which to apply the color and texture placement; and applying the color and texture placement to the object within the three-dimensional model.

Example 3 is a method as in any of Examples 1-2, wherein the three-dimensional model of the scene comprises an interactive three-dimensional rendering of an architectural floorplan, and wherein the object within the three-dimensional model comprises one or more of a construction material, a design material, a plumbing fixture, a lighting fixture, a furnishing, a cabinet, a countertop, a backsplash, flooring, or a wall.

Example 4 is a method as in any of Examples 1-3, wherein the database comprises a plurality of texture files, and wherein each of the plurality of texture files comprise texture information for rendering a texture on a three-dimensional model, wherein the plurality of texture files comprises texture information for one or more of: a construction material, a design material, a plumbing fixture, a lighting fixture, a furnishing, a cabinet, a countertop, a backsplash, flooring, or a wall.

Example 5 is a method as in any of Examples 1-4, further comprising receiving an indication of an identity of the object within the image, and wherein identifying the object within the image comprises: providing the image to a first neural network trained to locate the object within the image; and receiving an indication from the first neural network comprising a location of the object within the image.

Example 6 is a method as in any of Examples 1-5, wherein identifying the object within the image further comprises: providing a subsection of the image comprising the object to a second neural network trained to determine an identity of the object; and receiving an indication from the second neural network comprising the identity of the object; wherein the method further comprises determining whether a texture file comprising a same or similar identity as the identity of the object is stored within the database.

Example 7 is a method as in any of Examples 1-6, further comprising: determining an approximate size of the object within the image; applying the approximate size of the object to the color and texture placement; and providing a means for a user to adjust a scale of the color and texture placement within the rendered scene such that a relative size of the color and texture placement is adjusted relative to other objects within the rendered scene.

Example 8 is a method as in any of Examples 1-7, further comprising: generating a three-dimensional model of a scene; receiving an indication from a user to adhere a digital sticky note at a location within the three-dimensional model; and generating the digital sticky note and applying the digital sticky note to the location within the three-dimensional model.

Example 9 is a method as in any of Examples 1-8, further comprising storing information in connection with the digital sticky note, wherein the information comprises one or more of: an image, a video stream, a web address to an image or website, text, a mathematical representation, a texture file, a graph, an illustration, a hyperlink, an inspiration board, or a budget.

Example 10 is a method as in any of Examples 1-9, wherein: receiving the image comprising the object comprises receiving the image from the user in connection with the digital sticky note; receiving the indication of the color comprises receiving the indication of the color from the user in connection with the digital sticky note; and storing the information in connection with the digital sticky note comprises storing the image comprising the object and the indication of the color in connection with the digital sticky note.

Example 11 is a method as in any of Examples 1-10, wherein the method further comprises: determining an identity of a rendered object at the location within the three-dimensional model; and applying the color and texture placement to the rendered object; wherein the rendered object comprises one or more of a construction material, a design material, a plumbing fixture, a lighting fixture, a furnishing, a cabinet, a countertop, a backsplash, flooring, or a wall.

Example 12 is a method. The method includes generating a digital sticky note to be stored in connection with a file. The method includes storing a coordinate location in connection with the digital sticky note, wherein the coordinate location indicates where the digital sticky note should be displayed within the file. The method includes aggregating data to be stored in connection with the digital sticky note, wherein the data comprises information applicable to the coordinate location.

Example 13 is a method as in Example 12, further comprising receiving an indication to generate the digital sticky note at the coordinate location, wherein the indication is received from one or more of: a user providing a computer-implemented instruction; or a neural network trained to recommend one or more coordinate locations within the file for creating a digital sticky note.

Example 14 is a method as in any of Examples 12-13, wherein aggregating the data comprises aggregating one or more types of data selected from a group comprising: an image, a video stream, a hyperlink, media available via a hyperlink, text, an inspiration board, a numerical entry, a geographic location coordinate, or a budget.

Example 15 is a method as in any of Examples 12-14, further comprising connecting the digital sticky note to an application program interface (API) such that a user may communicate with the API by way of the digital sticky note.

Example 16 is a method as in any of Examples 12-15, further comprising: receiving an image to be stored in connection with the digital sticky note at the coordinate location; receiving an indication that a texture object displayed in the image should be associated with the coordinate location; and providing the image to a neural network trained to determine an identity of the texture object displayed in the image.

Example 17 is a method as in any of Examples 12-16, wherein the file comprises a three-dimensional model of a space, and wherein the method further comprises: receiving from the neural network the identity of the texture object; retrieving from a database a texture file equivalent to or approximating the identity of the texture object displayed in the image; merging the texture file with a color indication to generate a color-texture placement; and applying the color-texture placement to the coordinate location within the three-dimensional model of the space.

Example 18 is a method as in any of Examples 12-17, wherein the file comprises a three-dimensional model of a space, and wherein the method further comprises providing the three-dimensional model of the space to a user such that the user can select the coordinate location by selecting an object within the three-dimensional model.

Example 19 is a method as in any of Examples 12-18, wherein the space comprises an architectural floorplan, and wherein the object within the three-dimensional model comprises one or more of: a wall, a door, a window, a cabinet, a countertop, a floor, a plumbing fixture, an electrical fixture, a furnishing, or a surface where a construction material and/or a design material can be affixed.

Example 20 is a method as in any of Examples 12-19, wherein the data to be stored in connection with the digital sticky note is applicable to the object within the three-dimensional model, and wherein the method further comprises: identifying a texture object within the data stored in connection with the digital sticky note, wherein the texture object comprises one or more of: a construction material, a design material, flooring, a plumbing fixture, an electrical fixture, or a furnishing; determining a color to be applied in connection with the texture object; retrieving from a database a texture file equivalent to or approximating the texture object; merging the texture file and the color to generate a color-texture placement; and applying the color-texture placement to the object within the three-dimensional model.

Example 21 is a method as in any of Examples 12-20, further comprising displaying the digital sticky note on a rendering of the file, wherein the digital sticky note comprises an icon that can be selected by a user to display the aggregated data.

Example 22 is a system comprising one or more processors for executing instructions stored in non-transitory computer readable storage media, wherein the instructions comprise any of the method steps of Examples 1-21.

Example 23 is non-transitory computer readable storage media storing instructions for execution by one or more processors, wherein the instructions comprise any of the method steps of Examples 1-21.

Reference throughout this specification to "an example" means that a particular feature, structure, or characteristic described in connection with the example is included in at least one embodiment of the present disclosure. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present disclosure may be referred to herein along with alternatives for the various components thereof. It is understood that such embodiments, examples, and alternatives are not to be construed as de facto equivalents of one another but are to be considered as separate and autonomous representations of the present disclosure.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive.

Those having skill in the art will appreciate that many changes may be made to the details of the above-described embodiments without departing from the underlying principles of the disclosure.

What is claimed is:

1. A method comprising:
    generating a digital sticky note to be stored in connection with a file;
    storing a coordinate location in connection with the digital sticky note, wherein the coordinate location indicates where the digital sticky note should be displayed within the file; and
    aggregating data to be stored in connection with the digital sticky note, wherein the data comprises information applicable to the coordinate location;
    wherein the file comprises a three-dimensional model of a space, and wherein the method further comprises providing the three-dimensional model of the space to a user such that the user can select the coordinate location by selecting an object within the three-dimensional model.

2. The method of claim 1, further comprising receiving an indication to generate the digital sticky note at the coordinate location, wherein the indication is received from one or more of:
    the user providing a computer-implemented instruction; or a neural network trained to recommend one or more coordinate locations within the file for creating a digital sticky note.

3. The method of claim 1, wherein aggregating the data comprises aggregating one or more types of data selected from a group comprising: an image, a video stream, a hyperlink, media available via a hyperlink, text, an inspiration board, a numerical entry, a geographic location coordinate, or a budget.

4. The method of claim 1, further comprising connecting the digital sticky note to an application program interface (API) such that a user may communicate with the API by way of the digital sticky note.

5. The method of claim 1, further comprising:
    receiving an image to be stored in connection with the digital sticky note at the coordinate location;
    receiving an indication that a texture object displayed in the image should be associated with the coordinate location; and
    providing the image to a neural network trained to determine an identity of the texture object displayed in the image.

6. The method of claim 5, further comprising:
    receiving from the neural network the identity of the texture object;
    retrieving from a database a texture file equivalent to or approximating the identity of the texture object displayed in the image;
    merging the texture file with a color indication to generate a color-texture placement; and
    applying the color-texture placement to the coordinate location within the three-dimensional model of the space.

7. The method of claim 1, wherein the space comprises an architectural floorplan, and wherein the object within the three-dimensional model comprises one or more of: a wall, a door, a window, a cabinet, a countertop, a floor, a plumbing fixture, an electrical fixture, a furnishing, or a surface where a construction material and/or a design material can be affixed.

8. The method of claim 7, wherein the data to be stored in connection with the digital sticky note is applicable to the object within the three-dimensional model, and wherein the method further comprises:
- identifying a texture object within the data stored in connection with the digital sticky note, wherein the texture object comprises one or more of: a construction material, a design material, flooring, a plumbing fixture, an electrical fixture, or a furnishing;
- determining a color to be applied in connection with the texture object;
- retrieving from a database a texture file equivalent to or approximating the texture object;
- merging the texture file and the color to generate a color-texture placement; and
- applying the color-texture placement to the object within the three-dimensional model.

9. The method of claim 1, further comprising displaying the digital sticky note on a rendering of the file, wherein the digital sticky note comprises an icon that can be selected by a user to display the aggregated data.

10. A system comprising one or more processors configurable to execute instructions stored in non-transitory computer readable storage media, the instructions comprising:
- generating a digital sticky note to be stored in connection with a file;
- storing a coordinate location in connection with the digital sticky note, wherein the coordinate location indicates where the digital sticky note should be displayed within the file; and
- aggregating data to be stored in connection with the digital sticky note, wherein the data comprises information applicable to the coordinate location;
- wherein the file comprises a three-dimensional model of a space, and wherein the method further comprises providing the three-dimensional model of the space to a user such that the user can select the coordinate location by selecting an object within the three-dimensional model.

11. The system of claim 10, wherein the instructions further comprise receiving an indication to generate the digital sticky note at the coordinate location, wherein the indication is received from one or more of:
- the user providing a computer-implemented instruction; or
- a neural network trained to recommend one or more coordinate locations within the file for creating a digital sticky note.

12. The system of claim 10, wherein the instructions are such that aggregating the data comprises aggregating one or more types of data selected from a group comprising: an image, a video stream, a hyperlink, media available via a hyperlink, text, an inspiration board, a numerical entry, a geographic location coordinate, or a budget.

13. The system of claim 10, wherein the instructions further comprise connecting the digital sticky note to an application program interface (API) such that the user may communicate with the API by way of the digital sticky note.

14. The system of claim 10, wherein the instructions further comprise:
- receiving an image to be stored in connection with the digital sticky note at the coordinate location;
- receiving an indication that a texture object displayed in the image should be associated with the coordinate location; and
- providing the image to a neural network trained to determine an identity of the texture object displayed in the image.

15. Non-transitory computer readable storage media storing instructions for execution by one or more processors, the instructions comprising:
- generating a digital sticky note to be stored in connection with a file;
- storing a coordinate location in connection with the digital sticky note, wherein the coordinate location indicates where the digital sticky note should be displayed within the file; and
- aggregating data to be stored in connection with the digital sticky note, wherein the data comprises information applicable to the coordinate location;
- wherein the file comprises a three-dimensional model of a space, and wherein the instructions further comprise providing the three-dimensional model of the space to a user such that the user can select the coordinate location by selecting an object within the three-dimensional model.

16. The non-transitory computer readable storage media of claim 15, wherein the instructions further comprise receiving an indication to generate the digital sticky note at the coordinate location, wherein the indication is received from one or more of:
- the user providing a computer-implemented instruction; or a neural network trained to recommend one or more coordinate locations within the file for creating a digital sticky note.

17. The non-transitory computer readable storage media of claim 15, wherein the space comprises an architectural floorplan, and wherein the object within the three-dimensional model comprises one or more of: a wall, a door, a window, a cabinet, a countertop, a floor, a plumbing fixture, an electrical fixture, a furnishing, or a surface where a construction material and/or a design material can be affixed.

18. The non-transitory computer readable storage media of claim 17, wherein the data to be stored in connection with the digital sticky note is applicable to the object within the three-dimensional model, and wherein the instructions further comprise:
- identifying a texture object within the data stored in connection with the digital sticky note, wherein the texture object comprises one or more of: a construction material, a design material, flooring, a plumbing fixture, an electrical fixture, or a furnishing;
- determining a color to be applied in connection with the texture object;
- retrieving from a database a texture file equivalent to or approximating the texture object;
- merging the texture file and the color to generate a color-texture placement; and
- applying the color-texture placement to the object within the three-dimensional model.

19. The non-transitory computer readable storage media of claim 15, wherein the instructions further comprise displaying the digital sticky note on a rendering of the file, wherein the digital sticky note comprises an icon that can be selected by a user to display the aggregated data.

20. A method comprising:
- generating a digital sticky note to be stored in connection with a file;
- storing a coordinate location in connection with the digital sticky note, wherein the coordinate location indicates where the digital sticky note should be displayed within the file;

receiving an image to be stored in connection with the digital sticky note at the coordinate location;

receiving an indication that a texture object displayed in the image should be associated with the coordinate location;

providing the image to a neural network trained to determine an identify of the texture object displayed in the image; and aggregating data to be stored in connection with the digital sticky note, wherein the data comprises information applicable to the coordinate location.

21. The method of claim 20, wherein the file comprises a three-dimensional model of a space, and wherein the method further comprises:

receiving from the neural network the identity of the texture object;

retrieving from a database a texture file equivalent to or approximating the identity of the texture object displayed in the image;

merging the texture file with a color indication to generate a color-texture placement; and applying the color-texture placement to the coordinate location within the three-dimensional model of the space.

* * * * *